United States Patent [19]

Grudkowski

[11] Patent Number: 4,495,431
[45] Date of Patent: Jan. 22, 1985

[54] LOW REFLECTIVITY SURFACE-MOUNTED ELECTRODES ON SEMICONDUCTIVE SAW DEVICES

[75] Inventor: Thomas W. Grudkowski, Glastonbury, Conn.

[73] Assignee: United Technologies Corporation, Hartford, Conn.

[21] Appl. No.: 525,185

[22] Filed: Aug. 22, 1983

[51] Int. Cl.³ .............................................. H03H 9/25
[52] U.S. Cl. .............................. 310/313 B; 333/154; 357/15; 357/67
[58] Field of Search ....................... 310/313 B, 364; 333/152, 154; 357/15, 67

[56] References Cited

U.S. PATENT DOCUMENTS

| | | | |
|---|---|---|---|
| 4,104,672 | 8/1978 | DiLorenzo | 357/22 |
| 4,207,546 | 6/1980 | Grudkowski | 333/152 |
| 4,247,903 | 1/1981 | Grudkowski et al. | 364/821 |
| 4,301,188 | 11/1981 | Niehaus | 357/67 |
| 4,328,473 | 5/1982 | Montress et al. | 333/154 |

OTHER PUBLICATIONS

Grudkowski, T. W., et al., "IC Compatible Saw Devices on GaAs" 1981 IEEE MTT-S International Microwave Symposium Digest, L. A., Cal., 15-19 Jun. 1981.

Primary Examiner—William M. Shoop
Assistant Examiner—D. L. Rebsch
Attorney, Agent, or Firm—Melvin P. Williams; Francis J. Maguire, Jr.

[57] ABSTRACT

Low reflectivity electrodes (2, 7) are provided on semiconductive and piezoelectric substrates (1, 6) including a layer (3, 9) of gold-germanium mixture and a layer (5, 8) of raw gold, or only a gold-germanium mixture (10), the total germanium content of the electrode comprising approximately 2%-3% of the total gold and germanium content of the electrode, and the thickness of the electrode being on the order of 1% of the acoustic wavelength.

6 Claims, 3 Drawing Figures

LOW REFLECTIVITY SURFACE-MOUNTED ELECTRODES ON SEMICONDUCTIVE SAW DEVICES

DESCRIPTION

1. Technical Field

This invention relates to surface acoustic wave (SAW) devices and more particularly to provision of surface-mounted electrodes having low SAW reflectivity on semiconductive SAW devices.

2. Background Art

The utilization of piezoelectric material (such as quartz and lithium niobate) to provide surface acoustic wave devices is well known. Such devices may be simply tapped delay lines, resonators, oscillators, or more sophisticated signal processors such as transversal filters. A primary limitation on the performance of devices which rely on surface acoustic waves is the acoustic reflections which occur between input and output transducers or between various types of electrodes or taps which are situated within the acoustic propagation path. These reflections manifest themselves as undesirable perturbations of various types: the frequency response of a filter; unwanted spurious responses; dynamic range degradation; and, in SAW convolver or correlator applications, decreased peak-to-sidelobe performance.

In the case of SAW reflections in devices employing quartz substrates, reflection of the SAW wave by the electrodes has been significantly reduced by burying the electrodes in the quartz, as reported by Tanski et al, "The Design of SAW Resonators on Quartz With Emphasis on Two Ports", *Proceedings of the 1976 Ultrasonic Symposium*, IEEE No. 76CH1120-5SU, pp 260-265, 1976, and by Li, "310-MHz SAW Resonator With Q at the Material Limit", *Applied Physics Letters*, Volume 31, No. 7, 1977, pp 407-409.

In contrast, attempts to reduce reflectivity in lithium niobate SAW devices have required use of double electrodes operating at an eighth of a wavelength periodicity, as reported by Bristol et al, "Applications of Double Electrodes in Acoustic Surface Wave Device Design", *Proceedings of the 1972 IEEE Ultrasonics Symposium*, pp 343-345. However, the required resolution is difficult to attain in high frequency devices; and the technique may be inapplicable to FET tap structures.

There are a large number of SAW devices which require or utilize semiconductive properties along with piezoelectric properties. These include: an internal mixing SAW signal processor described in U.S. Pat. No. 4,207,546; the isolated gate FET SAW signal processor of U.S. Pat. No. 4,247,903; the programmable internal mixing signal processor of U.S. Pat. No. 4,328,473; and, in the carrier concentration controlled variable delay devices and resonator/oscillator of U.S. Pat. Nos. 4,233,573 and 4,354,166. These and other devices require that the SAW substrate have both piezoelectric and semiconductive properties, as do any monolithic devices which include electronic devices on the same substrate as the associated SAW device. The utilization of a gallium arsenide substrate is known to provide the combined electronic and acoustic properties required for such devices.

A difficulty in providing SAW devices which employ electronic phenomenon within the acoustic path itself is the need to provide both ohmic and rectifying contact between the electrodes and the substrate, in dependence upon the function being performed. For instance, the launching and receiving transducers must have rectifying contact with the substrate, as do the gates of any field effect devices formed therein. On the other hand, the source and drain and other conductors may require ohmic contact with the substrate. Thus, the difficulty of providing low reflectivity is compounded by the need for different electric contact with the substrate.

The reduction of SAW reflectivity from electrodes in semiconductive SAW devices has been achieved with buried electrodes, as is described in a commonly owned, copending U.S. patent application entitled "Low Reflectivity Electrodes In Semiconductive SAW Devices, Ser. No. 525,204 filed contemporaneously herewith by Grudkowski. Therein, ion milling or etching is utilized to form grooves or slots into which aluminum or chromium/aluminum/chromium electrodes are deposited, to provide rectifying or ohmic contact with the substrate, as the need requires. However, that approach has the obvious disadvantage of requiring the additional milling and/or etching steps to provide the grooves or slots within which the electrodes are provided. And, there is difficulty in achieving electrode surfaces which are coplanar with the substrate surface (due to overfilling or underfilling). Furthermore, the milling and etching steps can alter the semiconductive and/or acoustic properties of the substrate. There are, therefore, some applications in which utilization of surface-mounted electrodes are to be preferred, even though low reflectivity may also be a requirement.

DISCLOSURE OF INVENTION

Objects of the invention include reduction of SAW reflections from electrodes mounted on the surface of semiconductive SAW devices.

According to the present invention, electrodes on semiconducting SAW devices comprise gold-germanium, with the germanium being about 2% of the total, either in a single layer of mix or in a layer of mix with the germanium comprising a higher percentage (such as 10%-15%) of the mixture, together with a layer of gold to bring the percentage of germanium to the total gold down to 2%-3%, the thickness of the electrodes being a very small fraction of the design acoustic wavelength of the device. According further to the invention, the layers of gold-germanium and gold may be separated by a thin layer of nickel. In still further accord with the present invention, the order in which the layers are laid down above the substrate may be selected in dependence upon the performance which is desired for the electrode being formed. For instance, if rectifying (Schottky barrier) junctions are desired, a gold layer may be first laid on the substrate, and a gold-germanium layer may be laid above it. On the other hand, if ohmic contact between the electrode and the substrate is desired, a gold-germanium layer of high germanium content may be laid on the substrate, and a gold layer laid down above it (with or without an interleaved layer of nickel, as described hereinbefore). In still further accord with the invention, the nonreflecting contacts of the present invention can be made with non-alloyed gold-germanium to provide rectifying contact (Schottky barrier) with the substrate, as may be required to provide electroacoustic transducers and to provide gates of field effect transistors directly on the substrate. On the other hand, transducers on semi-insulating substrates may include alloyed gold-germanium mixtures. To provide ohmic contact with a semiconductive or semi-insulating substrate, a gold-germanium mixture on the substrate surface may be alloyed after deposition.

The present invention, by utilizing the combination of a particular ratio of total gold and germanium, together with a total contact thickness of the gold-germanium and other metal layers (gold and nickel), chosen to be very small compared with the design acoustic wavelength involved (e.g., on the order of 1% thereof), provides the low reflectivity of the present invention. Thus, although gold-germanium mixtures have been used to provide ohmic contacts, on the order of 2,000 angstroms thick, for sources and drains in acoustically-reactive FET devices (such as in U.S. Pat. No. 4,207,546), the ratio of the mixtures in such cases included significantly more germanium, being on the order of 12% of the total metal (gold and germanium mixture) of the electrode.

The invention provides low reflectivity SAW devices having electrical as well as acoustical properties inherent therein, with both ohmic and rectifying-junction electrical contact to the substrate, without the need of slots or grooves.

The foregoing and other objects, features and advantages of the present invention will become more apparent in the light of the following detailed description of exemplary embodiments thereof, as illustrated in the accompanying drawing.

BEST MODE FOR CARRYING OUT THE INVENTION

Figure 1:
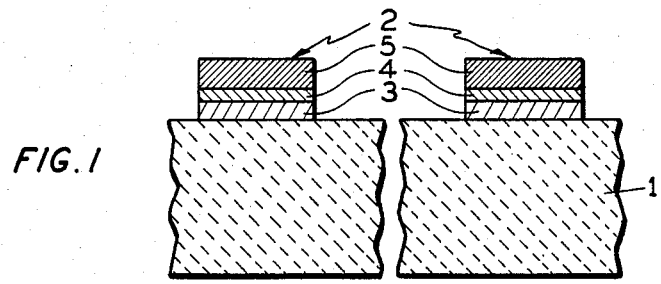
FIGS. 1-3 are simplified sectional views of a segment of a SAW device employing electrodes formed on the surface thereof in accordance with various embodiments of the present invention.

Referring now to FIG. 1, a SAW device includes a substrate 1 having a plurality of electrodes 2 each of which comprises a first layer 3 deposited directly on the surface of the substrate 1 and consisting of a mixture of gold and germanium, with substantially 10%-15% germanium in the mixture; a second layer 4 of nickel; and a third layer 5 of gold. The layers 3-5 may be on the order of 350 angstroms, 300 angstroms, and 1350 angstroms, respectively, for operation at about 150 MHz, on a substrate of gallium arsenide. A simple acoustic delay line having input and output acoustoelectric transducers formed as described with respect to FIG. 1 was found to have a level of triple transit reflected waves 62 dB below the main response as compared with surface-mounted transducers in a similar device fabricated in accordance with the teachings of the prior art, in which the triple transit reflection is only 15 dB-25 dB below the main response. In such a device, it was found that the effective SAW transducer velocity was lowered by approximately 3.5% in contrast with a similar device on which the electrode metalization was chromium/aluminum/chromium layers of the type known in the prior art. The magnitude of slowing is also dependent upon the total thickness of the electrodes 2. However, the slowing of the acoustic velocity can be compensated for in the design of the spatial periodicity of the acoustoelectric transducers.

A device of the type described with respect to FIG. 1 may constitute the acoustoelectric transducers, or other electrode elements, such as the components of field effect transistors or other taps, on semiconductive SAW devices. For transducers, a rectifying junction, such as a Schottky barrier, is required, and similarly for the gate of a field effect transistor. For the source and drain of a field effect transistor, an ohmic contact is desired. Depending on the particular type of element being fabricated, the gold-germanium layer 3 would not be alloyed in order to provide a rectifying (Schottky) contact with the substrate 1. But to provide highly ohmic contact with the substrate 1, the gold-germanium layer 3 would be alloyed prior to depositing the additional layers 4, 5. This may be accomplished by heating to 380° C.–400° C. for between one and thirty minutes, in the usual case.

Figure 2:
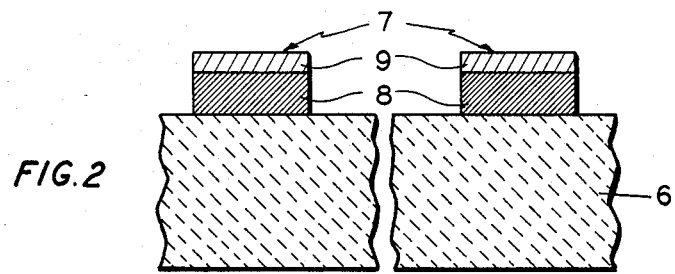

As described briefly hereinbefore, various modifications can be made in the invention. In FIG. 2, the substrate 6 is provided an electrode 7 by having the gold layer 8 deposited on it first, followed by the gold-germanium layer 9. And no nickel layer is shown in the embodiment of FIG. 2. The nickel is required only to resist balling of the gold when it is applied directly to the gold-germanium layer, and facilitates ohmic contact alloying at higher temperature. Depositing the raw gold first may be useful where ohmic contacts are not required, since gold is never ohmic on gallium arsenide except at extremely high doping levels (in excess of $10^{18}$ carriers/cm$^3$). The total thickness in the embodiment of FIG. 2 would comprise the thickness of the layers 7, 8; in contrast, the total thickness in the embodiment of FIG. 1 comprises the thickness of all three layers 3–5. Similarly, the germanium to gold ratio can be dependent upon the total amount of gold used, both in the gold-germanium layer and in the raw gold layer. Thus, the mixture could have more germanium in it (e.g., for better ohmic contact) if the raw gold layer were sufficiently thicker to provide the additional gold molecules so as to bring the ratio within the approximately 2%–3% range described hereinbefore.

Figure 3:
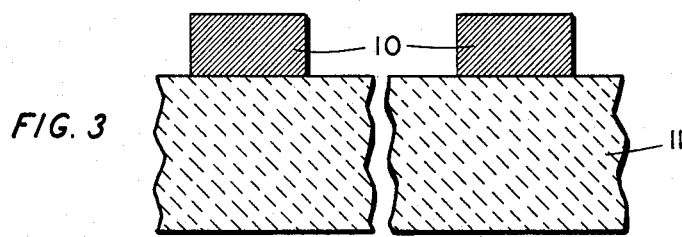

In FIG. 3, the electrodes 10 are formed by only a single layer deposited on the substate 11. This layer would be a mix of gold and germanium of which the germanium comprises 2%–3%, as described hereinbefore, alloyed or not, depending on the desired function.

The invention may be used in various forms in a wide variety of devices, including those of the aforementioned patents, all of which are incorporated herein by reference, and others.

Similarly, although the invention has been shown and described with respect to exemplary embodiments thereof, it should be understood by those skilled in the art that the foregoing and various other changes, omissions and additions may be made therein and thereto, without departing from the spirit and the scope of the invention.

I claim:

1. A surface acoustic wave device comprising:
   a substrate of semiconducting and piezoelectric material; and
   metallic electrodes formed on the surface of said substrate, characterized by:
   said electrodes comprising gold and germanium with germanium consisting of about 2%–3% of the total gold and germanium, said electrodes having thickness which is a small fraction of the design acoustic wavelength of the device.

2. A surface acoustic wave device according to claim 1 further characterized by said electrodes comprising a layer of raw gold and a layer of gold-germanium mixture.

3. A surface acoustic wave device according to claim 2 wherein said electrode comprises a layer of nickel disposed between said layer of gold and said layer of gold-germanium.

4. A surface acoustic wave device according to claim 1 further characterized by:
said electrode comprising said gold layer disposed adjacent the surface of said substrate.

5. A surface acoustic wave device according to claim 1 further characterized by:
said electrode including said gold-germanium layer disposed adjacent the surface of said substrate.

6. A surface acoustic wave device according to claim 5 wherein said gold-germanium layer is alloyed, thereby providing ohmic contact with said substrate.

* * * * *

UNITED STATES PATENT AND TRADEMARK OFFICE
CERTIFICATE OF CORRECTION

PATENT NO. : 4,495,431

DATED : January 22, 1985

INVENTOR(S) : Thomas W. Grudkowski and Gary K. Montress

It is certified that error appears in the above-identified patent and that said Letters Patent is hereby corrected as shown below:

On the First Page of the Patent:

Under the ICIREPAT country identification, INID Code [19], i.e., under "United States Patent" and after "Grudkowski" insert the words -- et al --

After the first inventor's name (INID Code [75]), i.e., "Thomas W. Grudkowski; Glastonbury, Conn.", insert the words --; Gary K. Montress, Westford, Mass. --

Signed and Sealed this

Twenty-fourth Day of September 1985

[SEAL]

Attest:

DONALD J. QUIGG

Attesting Officer

Commissioner of Patents and
Trademarks—Designate